United States Patent
Katti

(10) Patent No.: US 7,193,892 B2
(45) Date of Patent: *Mar. 20, 2007

(54) MAGNETIC SWITCHING WITH EXPANDED HARD-AXIS MAGNETIZATION VOLUME AT MAGNETORESISTIVE BIT ENDS

(75) Inventor: Romney R. Katti, Maple Grove, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/914,327

(22) Filed: Aug. 9, 2004

(65) Prior Publication Data

US 2005/0226064 A1   Oct. 13, 2005

Related U.S. Application Data

(63) Continuation of application No. 10/754,995, filed on Jan. 10, 2004, now Pat. No. 6,798,690.

(51) Int. Cl.
   *G11C 11/15* (2006.01)
(52) U.S. Cl. .................. 365/173; 365/171; 365/158
(58) Field of Classification Search ............ 365/158, 365/173, 171, 66, 63
   See application file for complete search history.

(56) References Cited

U.S. PATENT DOCUMENTS

| | | | |
|---|---|---|---|
| 5,214,840 A * | 6/1993 | Imagawa et al. ........ 29/603.08 |
| 5,756,366 A | 5/1998 | Berg et al. .................... 438/3 |
| 6,147,922 A | 11/2000 | Hurst et al. ............... 365/225.5 |
| 6,175,525 B1 | 1/2001 | Fulkerson et al. ...... 365/189.05 |
| 6,178,111 B1 | 1/2001 | Sather et al. ................ 365/158 |
| 6,455,177 B1 | 9/2002 | Everitt et al. ............... 428/693 |
| 6,493,258 B1 | 12/2002 | Lu et al. ..................... 365/158 |
| 6,798,690 B1 * | 9/2004 | Katti .......................... 365/158 |
| 2002/0130339 A1 | 9/2002 | Kishi et al. ................. 257/295 |
| 2002/0159203 A1 | 10/2002 | Saito et al. .............. 360/324.2 |
| 2003/0235070 A1 | 12/2003 | Ooishi ........................ 365/158 |

OTHER PUBLICATIONS

Hong et al., "Magnetic element Shape for Magnetic Random Access Memory (MRAM)", (May 28-29, 2003) (http://www.cambr.uidaho.edu/symposiums/symp11.asp), pp. 1-6.

Daughton, "Magnetoresistive Random Access Memory (MRAM," pp. 1-13 (Feb. 4, 2000).

Hertel, "Thickness Dependence of Magnetization Structures in Thin Permalloy Rectangles", Max-Planck-Institut fur Mikrostrukturphysik, Weinberg 2, 06120 Halle, Germany.

International Search Report, PCT/US2005/000664.

* cited by examiner

*Primary Examiner*—Andrew Q. Tran
(74) *Attorney, Agent, or Firm*—McDonnell Boehnen, Hulbert & Berghoff

(57) ABSTRACT

A magnetoresistive apparatus and method of operation with improved switching characteristics is provided. Switching of a magnetic direction of a magnetic layer of a magnetoresistive bit is promoted by parallel rotation of local magnetic direction of ends of the bit toward alignment with a hard-axis of the bit. Thus, an embodiment provides for expanded hard-axis magnetic volume of the bit ends to support hard-axis magnetization through bit shape alteration or doping, for example. A method provides for applying a hard-axis magnetic field to the bit ends for initiating switching and applying an easy-axis magnetic field for completing switching.

8 Claims, 6 Drawing Sheets

MAGNETIC SWITCHING WITH EXPANDED HARD-AXIS MAGNETIZATION VOLUME AT MAGNETORESISTIVE BIT ENDS

CROSS-REFERENCE TO RELATED APPLICATIONS

This application is a continuation of application Ser. No. 10/754,995, filed Jan. 10, 2004 now U.S. Pat. No. 6,798,690.

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetic memory and more specifically to magnetoresistive memory elements.

2. Related Art

The discovery of the giant magnetoresistive (GMR) effect has led to the development of a number of spin-based electronic devices. The GMR effect is observed in certain thin-film devices that are made up of alternating ferromagnetic and nonmagnetic layers. In a typical device, the relative orientations of magnetic directions of the ferromagnetic layers define a binary state of the device. The resistance across a device is generally lowest when the magnetic directions of the ferromagnetic layers are in a parallel orientation and highest when the magnetic directions are in an antiparallel orientation.

One type of GMR device is commonly referred to as a "spin valve." GMR devices, including spin valves, can be used as data storage elements in magnetic random access memory (MRAM) devices. In this regard, exemplary MRAM applications of GMR devices are described in U.S. Pat. Nos. 6,147,922; 6,175,525; 6,178,111; and 6,493,258, all of which are incorporated herein by reference.

A spin valve typically includes two ferromagnetic layers that are separated by a thin layer of a non-magnetic metal (usually copper) and also includes an antiferromagnetic layer that "pins" the magnetization direction of one of the ferromagnetic layers. FIG. 1a illustrates (in a simplified form) the layers in a typical spin valve 10 as seen from a side view. As shown in FIG. 1a, spin valve 10 includes ferromagnetic layers 12 and 14 separated by a nonmagnetic layer 16. In a typical arrangement, one of the magnetic layers is configured to be a fixed layer 14. Fixed layer 14 is adjacent to an anti-ferromagnetic layer 18, such that the magnetization direction of fixed layer 14 is "pinned" in a particular orientation. The arrow in fixed layer 14 indicates an exemplary pinned orientation, though, in general, the orientation could be pinned in either direction. Thus, the magnetization direction of fixed layer 14 remains relatively fixed when operational magnetic fields are applied to spin valve 10. A second magnetic layer 12 is termed a free layer 12. In contrast with the fixed layer 14, the magnetization direction of free layer 12 is free to switch between parallel and antiparallel orientations, as indicated by the double-arrow symbol in free layer 12. By applying an appropriate magnetic field to spin valve 10, the magnetization direction of free layer 12 can be inverted while the magnetization direction of fixed layer 14 remains the same. However, a more robust means is needed for inverting the magnetization directions of the ferromagnetic layers (12 and 14).

FIG. 1b shows a three-dimensional view of the spin valve 10 of FIG. 1a. As shown, the spin valve 10 has a hard-axis (short-axis) and an easy-axis (long-axis). In general, the magnetization directions of both the free layer 12 and the fixed layer 14 run substantially parallel to the easy-axis.

FIG. 1c shows a top view of a prior art magnetoresistive bit 20 that is substantially similar to the spin valves of FIGS. 1a and 1b. The bit 20 has a first bit end 22 and a second bit end 24 interconnected by an elongated body 26. As shown, the bit ends (22 and 24) are tapered. A magnetization direction 28 of a magnetic layer of the bit 20 is shown pointing toward the second bit end 24 and parallel to an easy-axis of the bit 20. A hard-axis is shown perpendicular to the easy-axis. The magnetization direction 28 is indicative of a logical state of the bit. Thus, the magnetization direction 28 pointing toward the second bit end 24 may be indicative of a first logical state. Conversely, the magnetization direction 28 could be inverted to point along the easy-axis toward the first bit end 22, and thus representing a second logical state. Bit ends 22 and 24 are tapered along the easy-axis. In a typical arrangement, the bit 20 is symmetrical about both the hard-axis and the easy-axis.

SUMMARY OF THE INVENTION

Research indicates that switching (inversion) of a logical state of a magnetoresistive bit is at least partially driven by local magnetization directions at each end of the bit. With this finding in mind, a magnetoresistive apparatus and method of operation are provided with improved switching characteristics.

According to one aspect of the invention, a magnetoresistive bit is provided with improved switching. The bit comprises a nonmagnetic layer sandwiched between two magnetic layers. Each magnetic layer has a first bit end and second bit end and an elongated body connecting the two bit ends. The bit ends each have an expanded magnetic volume for supporting hard-axis end magnetization for driving a switching process. Similarly, the elongated body is configured to support a body magnetization along an easy-axis of the bit for storing a binary state of the bit. The expanded magnetic volume may be achieved by, for example, a "C-shape", "S-shape", or "I-shape" bit configuration. Additionally, expanded magnetic volume may be generated by a tapered protrusion extending from each bit end along the hard-axis of the bit. Expanded magnetic volume may also be accomplished by magnetically hardening the bit ends. Another embodiment further comprises an expanded surface area along each bit end.

According to another aspect of the invention, a method is provided for switching the logical state of a current-in-plane magnetoresistive bit. The method comprises applying three magnetic fields to the bit. A first magnetic field is applied along a hard-axis of a first end of the bit, wherein the first end has an expanded magnetic volume for supporting a hard-axis magnetization. A second magnetic field is applied along the hard-axis of a second end of the bit, wherein the second end has an expanded magnetic volume for supporting a hard-axis magnetization. A third magnetic field is applied to a body of the bit, wherein the body is configured to support an easy-axis magnetization. In one embodiment, the first and second magnetic fields are applied for ensuring that both the first and second bit end have hard-axis magnetizations. The first and second magnetic fields may, for example, be applied by passing a current through a conducting line arranged near the bit. Another embodiment further comprises removing the three magnetic fields and, after removing the third magnetic field, retaining a body magnetization direction along the easy-axis. The body magnetization direction is indicative of the logical state of the bit.

In yet another aspect of the invention, a magnetoresistive cell is provided comprising a magnetoresistive bit; a word line; and a sense line. The bit further comprises a first magnetic layer and a second magnetic layer that sandwich a nonmagnetic layer. The magnetic layers each have a pair of bit ends with expanded magnetizability along a hard-axis of the bit, and each layer has a center magnetization direction along an easy-axis of the bit. The word line is arranged near the bit for applying a first magnetic field to the bit. The sense line is electrically connected to the bit for delivering a read current to the bit for determining a logical state of the bit. Additionally, the sense line may apply a second magnetic field to the bit. An embodiment further provides that the center magnetization direction of the first magnetic layer is fixed, and that the center magnetization direction of the second magnetic layer is free to rotate its direction in response to a magnetic field applied to the bit.

A further aspect provides a magnetoresistive device comprising a magnetoresistive bit having expanded hard-axis magnetization volume at each of two ends of the bit for supporting initiation of a state switching process.

DETAILED DESCRIPTION

1. Magnetic Switching Process

Figure 1A:
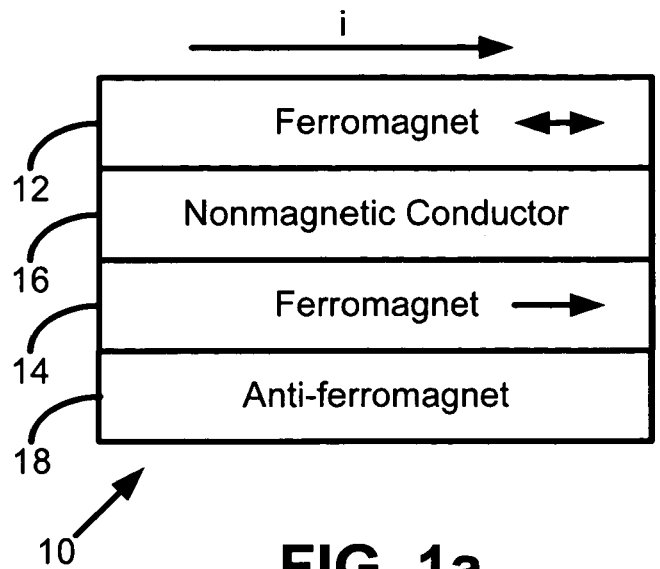
FIG. 1a is a schematic diagram of the layers of a prior art spin valve.
Figure 1B:
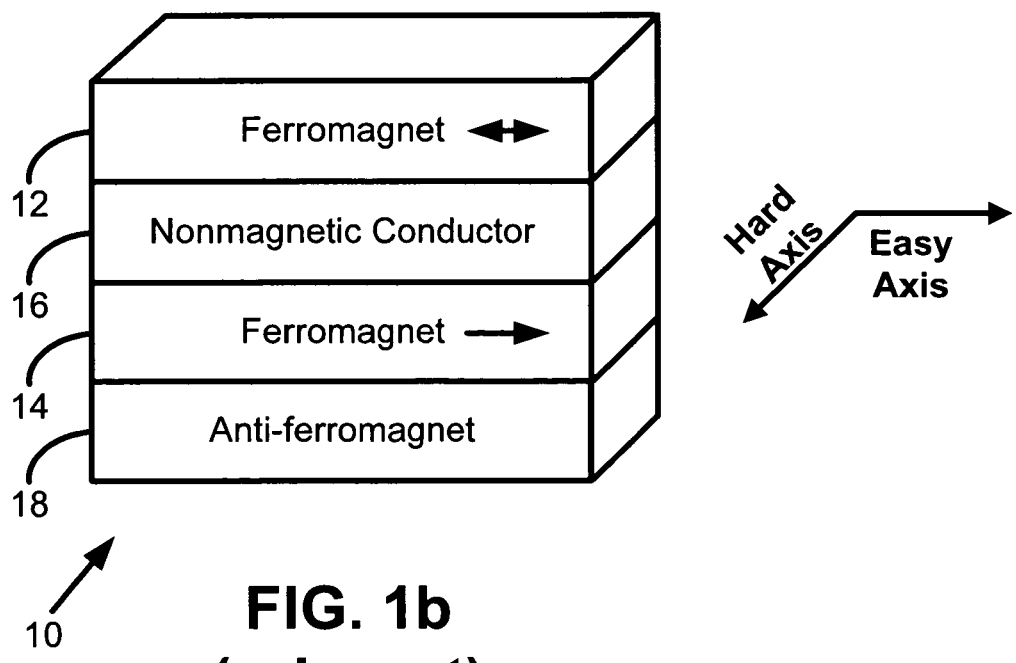
FIG. 1b is a three dimensional view of a prior art spin valve.
Figure 1C:
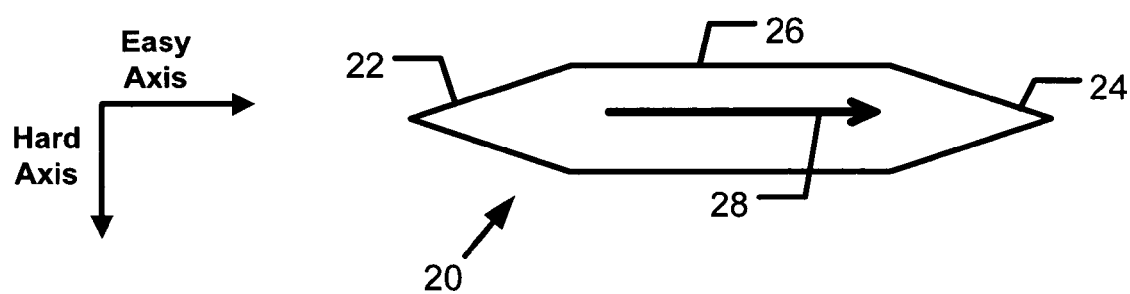
FIG. 1c is a top view of a prior art magnetoresistive bit.
Figure 2:
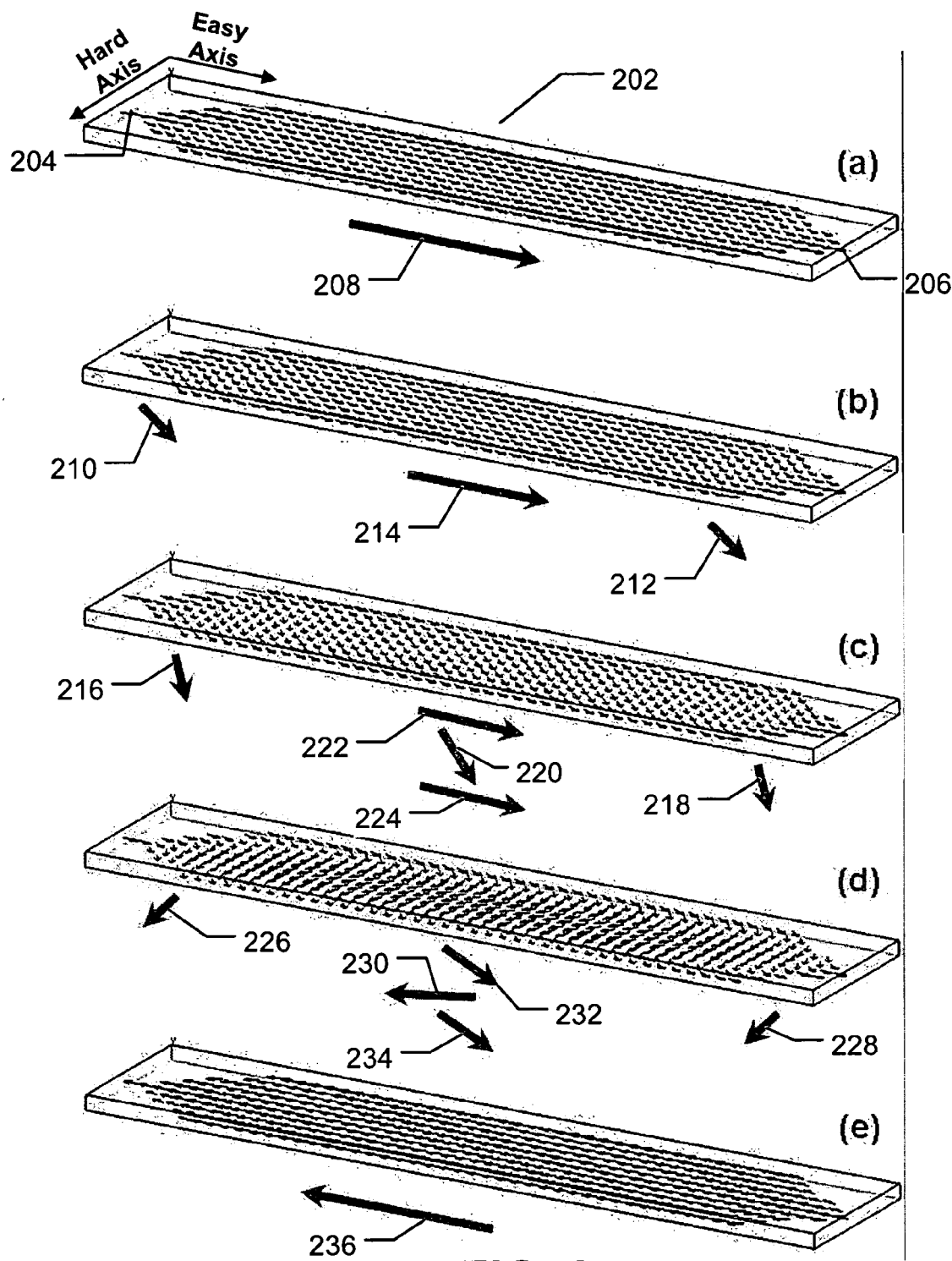
FIG. 2 is a sequential diagram of a magnetic switching process in a magnetic layer.

In a magnetoresistive bit with a pair of magnetic layers, a logical state of the bit is determinable from the magnetization directions of the magnetic layers. The logical state may be switched from a first state to a second state by switching (or inverting) the magnetization direction of one of the magnetic layers. Referring to FIG. 2, a series of frames chronicle a finite analysis of a magnetic switching process in a magnetic layer of a magnetoresistive bit. In general, the series shows that the switching process involves a coordinated rotation (or reversal) of elemental magnetization directions within the magnetic layer.

Looking first at Frame (a), a magnetic layer 202 is shown as an elongated element with tapered bit ends (204 and 206). For convenience, the bit ends are labeled a first bit end 204 and a second bit end 206. An easy-axis (long-axis) of the magnetic layer 202 is shown running parallel to the elongation of the magnetic layer 202. A hard-axis (short-axis) is aligned in the plane of the magnetic layer 202 and runs perpendicular to the easy-axis. Within magnetic layer 202, elemental magnetization directions are shown as small arrows pointing along the easy-axis toward the second bit end 206. Magnetic exchange between the bit ends and the body of the bit would tend to make the magnetization uniform and unidirectional. (Magnetization exchange is the ferromagnetic exchange that tends to magnetize a magnetic domain of an ensemble of atoms in a given direction.)

A summary arrow 208 shows a generalized magnetization direction of the magnetic layer 202 pointing along the easy-axis toward the second bit end 206. The uniform magnetization along the easy-axis as shown in Frame (a) is indicative of a first logical state.

Frames (b), (c), (d), and (e) represent the magnetic layer 202 in sequential scenes of a switching process. Thus, in parallel fashion, the first bit end 204 is the leftmost end of the magnetic layer in each frame, and the second bit end 206 is the rightmost end of the magnetic layer in each frame.

Jumping to Frame (e), the final frame, elemental magnetization directions are shown pointing along the easy-axis toward the first bit end 204. Frame (e) summary arrow 236 shows a generalized magnetization direction pointing in the opposite direction of Frame (a) summary arrow 208. The uniform magnetization along the easy-axis as shown in Frame (e) is indicative of a second logical state. Thus, the objective of a switching process is to switch the logical state of the magnetization layer 202 from the first logical state to the second logical state. Frames (b), (c), and (d) give further detail of the switching process.

In Frame (b), the elemental magnetization directions as shown by small arrows in the magnetic layer are no longer uniform across the entire magnetic layer. Specifically, elemental magnetization directions at the bit ends have begun to rotate clockwise toward the hard-axis. However, elemental magnetization directions in the elongated portion of the magnetic layer continue to point toward the second bit end 206. Frame (b) summary arrows (210, 212, and 214) mirror the elemental magnetization. In Frame (b), it can be seen that the switching process is initiated in the bit ends (204 and 206).

In Frame (c), the elemental magnetization directions show further rotation. Frame (c) summary arrows (216–224) mirror the rotation of the elemental magnetization directions. Bit end summary arrows (216 and 218) indicate further rotation of elemental magnetization directions at the bit ends (204 and 206). A center of the elongated portion of the magnetic layer has begun to rotate clockwise as shown by center summary arrow 220. Edge summary arrows (222 and 224) show little rotation and indicate that elemental magnetization directions along edges of the elongated portion continue to substantial point toward the second bit end 206.

In Frame (d), bit end summary arrows (226 and 228) indicate continued rotation of elemental magnetization directions in the bit ends (204 and 206). The center of the elongated portion continues to rotate as shown by summary arrow 230. Edge summary arrows (232 and 234) indicate that elemental magnetization directions along the edges has begun to rotate in earnest.

Finally, Frame (e) shows a completed rotation and reformation of the uniformity of elemental magnetization directions across the magnetic layer. FIG. 2 in general shows how switching of the magnetization direction of the magnetic layer is initiated in the bit ends, continues through the center of the layer, and completes with reversal of the edges.

As will be understood by one skilled in the art, the first and second logical states may be arbitrarily selected. Thus switching the magnetic layer from the second logical state to the first logical state involves a mirror-image procedure as switching from the first logical state to the second logical state. FIG. 2 is intended to serve as an example of a switching process and should not be seen as limiting.

2. Magnetoresistive Bit Architecture

In a preferred embodiment, a magnetoresistive bit is configured as a tri-layer element with a nonmagnetic layer (such as copper) sandwiched between two magnetic layers. Each magnetic layer is arranged with an elongated body interconnecting a first bit end and a second bit end. Each bit end has an expanded magnetic volume for supporting a magnetization along a hard-axis of the bit, wherein the hard-axis magnetization at the bit ends is useful for improving magnetic switching of the bit. The elongated body is configured to support a magnetization along the easy-axis of the bit for storing a logical state of the bit.

Figure 3:
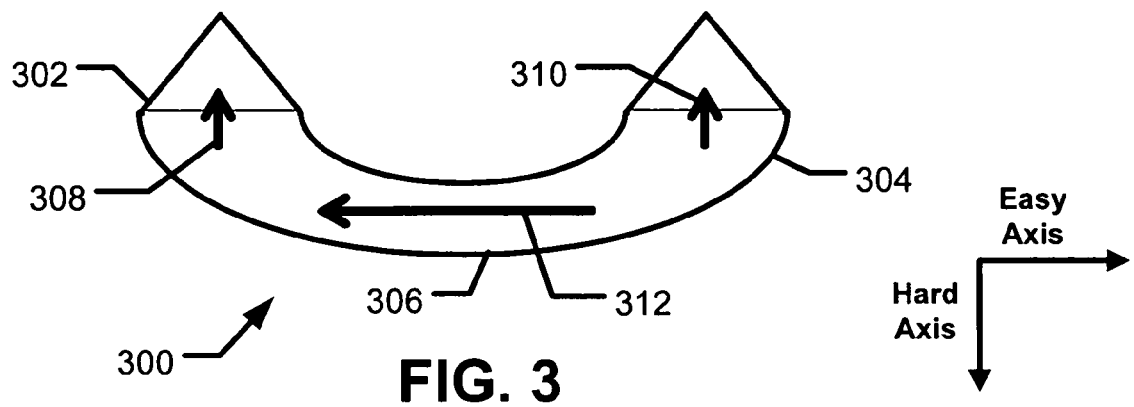
FIG. 3 is a top view of an embodiment of a magnetoresistive bit with an expanded magnetic volume in each bit end.

Referring to FIG. 3, a top view of an embodiment of a magnetoresistive bit 300 is shown. A first bit end 302 and a second bit end 304 are interconnected by an elongated body 306. The magnetoresistive bit 300 is shown with a "C-shape" asymmetry along an easy-axis. The shape is designed to increase a hard-axis magnetic volume at each bit end (302 and 304). Summary arrows (308, 310, and 312) are indicative of elemental magnetization directions in the bit 300 and correlate roughly to Frame (d) of FIG. 2.

In one embodiment, the expanded hard-axis magnetic volume allows for an improved transition from Frame (a) to Frame (b) and from Frame (b) to Frame (c). In a typical magnetoresistive bit, magnetization of the elongated body 312 is along the easy-axis and creates a demagnetizing field on the bit ends. In another embodiment, expanded hard-axis magnetic volume of the bit ends is configured to overcome the demagnetizing field.

Each bit end (302 and 304) additionally shows a tapered protrusion extending along the hard-axis. This protrusion is useful in increasing the bit end magnetic volume and may be used in other bit shapes than the "C-shape."

Figure 4:
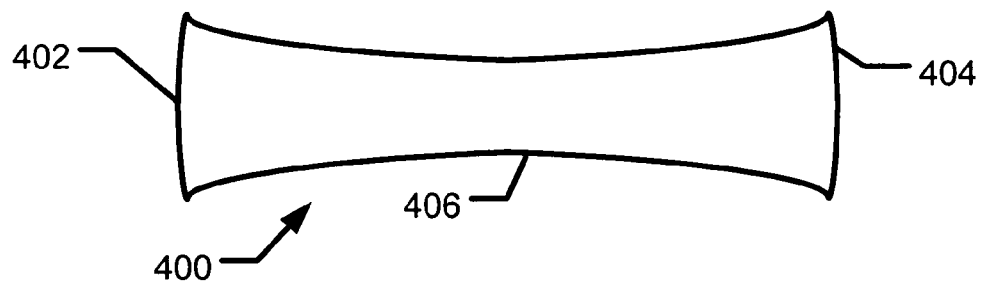
FIG. 4 is a top view of another embodiment of a magnetoresistive bit with an expanded magnetic volume in each bit end.

Referring to FIG. 4, a top view of a symmetrical magnetoresistive bit 400 is shown in accordance with an embodiment. Bit ends 402 and 404 each have an expanded magnetic volume and the two ends are interconnected by a body 406. Because of their shape, the bit ends 402 and 404 are termed to be in an "I-shape" configuration. (The shape of the bit 400 generally resembles an I-beam.) Bit ends 402 and 404 have an expanded end surface area. In a further embodiment, the surface area of the bit ends may be maximized relative to a bit end volume. This maximization ensures the greatest distribution of magnetic surface charge induced by the magnetization relative to the magnetic volume. In one embodiment, the expanded magnetic volume of the bit ends 402 and 404 is accomplished by an expanded surface area along each bit end.

Figure 5:
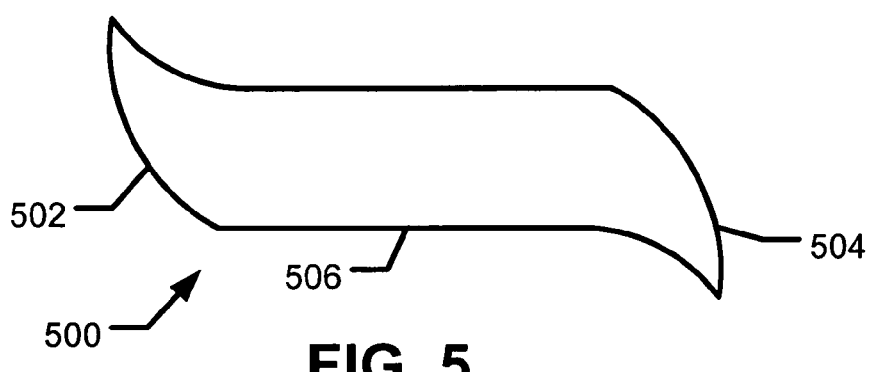
FIG. 5 is a top view of yet another embodiment of a magnetoresistive bit with an expanded magnetic volume in each bit end.

Referring to FIG. 5, a top view of an "S-shape" magnetoresistive bit 500 is shown in accordance with an embodiment. Each bit end (502 and 504) has an expanded magnetic volume along a hard-axis of the bit 500. An elongated body 506 interconnects the bit ends 502 and 504. This embodiment is exemplary of bits with asymmetries along both the hard-axis and an easy-axis of the bit.

The various bit shapes specifically disclosed herein should be seen as instructive rather than limiting. It will be apparent to those skilled in the art that additional bit shapes, both symmetrical and asymmetrical, are available for expanding hard-axis magnetic volume at the bit ends. Additionally, variations to the shapes shown are also available. For example, angles of curvature may be altered as can the degree of asymmetry according to specific design goals and constraints. Other arrangements that increase bit end magnetic volume in the direction of the hard-axis may be used.

In a further embodiment, the bit ends are magnetically hardened or doped for expanding the magnetization volume of the bit ends. A few to a few hundreds of monolayers may be subject to hardenening. In an embodiment, a thickness of between approximately 0.5 nanometers to 500 nanometers are subject to hardening. More typically, a hardening thickness at the bit ends of between approximately 50 nanometers to 100 nanometers is hardened.

In an exemplary embodiment, the magnetization direction of the bit ends is not stable despite the expanded hard-axis magnetic volume. Thus, as shown in the Frames of FIG. 2, the parallel magnetization of the of bit ends in the hard-axis direction is only present during the switching process and is not apparent in either of the logical states shown by Frames (a) and (e).

3. Magnetoresistive Cell Architecture

Figure 6:
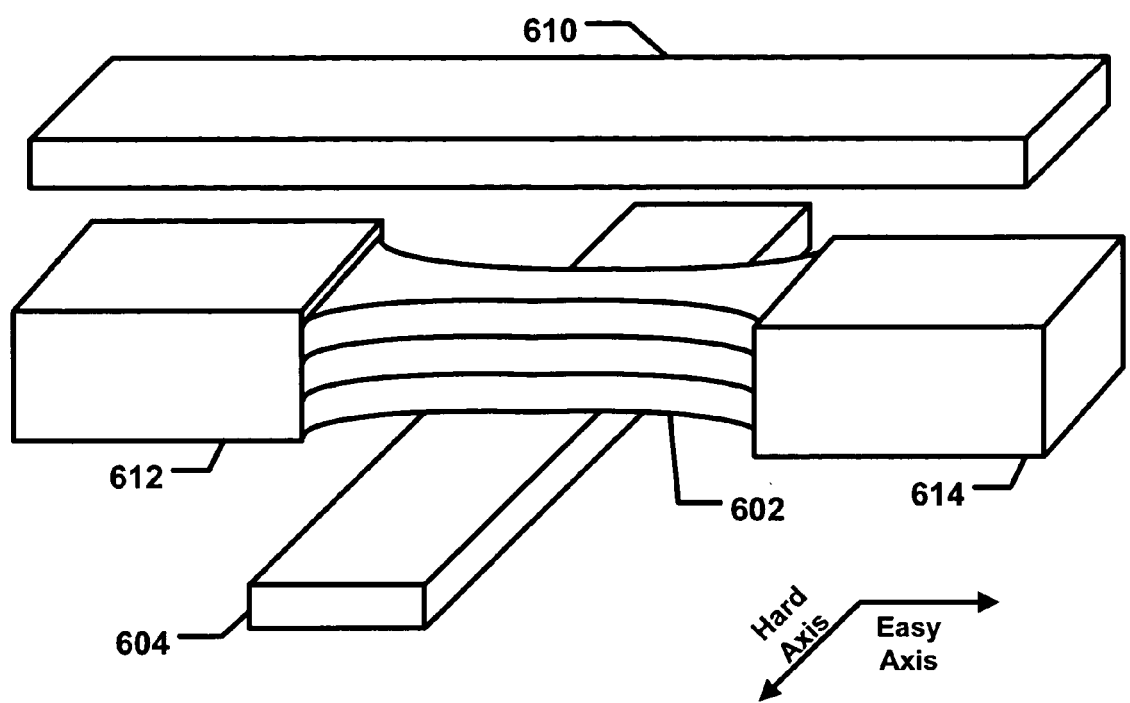
FIG. 6 is a three dimensional view of a magnetoresistive cell in accordance with an embodiment.

FIG. 6 shows an isometric view of an exemplary current-in-plane (CIP) magnetoresistive (MR) device. In this embodiment, a MR element 602 is shown as a tri-layer element having a nonmagnetic layer sandwiched between two ferromagnetic layers. The MR element has a hard-axis (short-axis) and an easy-axis (long-axis). As can be seen, the MR element 602 has expanded bit ends and an elongated body. A word line 604 is arranged near the MR element 602. As shown, the word line 604 runs parallel to the hard-axis. An insulator (not shown) separates the word line 604 from the MR element 602. A bit line 610 is arranged the near the MR element 602. The bit line 610 is insulated from the MR element 602. As shown, the bit line 610 runs along the easy-axis and is perpendicular to the word line 604. A first sense line 612 and a second sense line 614 abut the MR element 602. Generally, the two sense lines 612 and 614 are electrically connected to opposite edges of the nonmagnetic layer of the MR element 602. The two sense lines 612 and 614 may also be referred to as a single sense line.

Arrangement of the word line 604 and bit line 610 are such that a current passing through either (or both) will create a magnetic field acting on the MR element 602. A magnetic field created by a current passing through a line has a magnetic direction perpendicular to the flow of the current according to the "right hand rule" of elementary physics. Additionally, a further magnetic field may be created by a current passing through sense lines 612 and 614.

The word line 604 is arranged so that a current passing through it will create a first magnetic field along the easy-axis of the MR element 602. Likewise, the bit line 610 is arranged so that a current passing through it will create a second magnetic field along the hard-axis of the MR element 602. In one embodiment, the two magnetic fields additively combine to form a composite magnetic field that acts on the MR element 602. During a write sequence, a composite magnetic field is created to invert the magnetization direction of at least one layer of the MR element 602. Alternatively, the magnetic field applied along the hard-axis acts on the bit ends to drive a magnetic switching process, and the magnetic field applied along the easy-axis acts to complete the magnetic switching process.

In an embodiment, the configuration of the word line 604 and bit line 610 is designed such that a current through a single line will not switch the magnetization direction of a layer of the MR element. This may be termed a "half-select" system, whereby each line "half-selects" the MR element 602 for writing. When both "write" lines 604 and 610 are providing a current then the two "half-selects" additively combine to fully select the MR element. When the MR element is thus selected, the magnetization direction of a layer of the MR element is switched.

In a preferred embodiment, the word line 604 and bit line 610 are planar conducting lines that have a substantially greater width than height. The widths of the word line 604 and bit line 610 are merely shown as examples, various widths of each line is possible and the widths should be adjusted according to design parameters such as the MR element used and board size.

In FIG. 6, the MR element is shown positioned orthogonally to the word line 604 and bit line 610. This positioning is not required. In another embodiment, for example, the MR device is rotated by 30 degrees to achieve a better switching performance. In general, the MR device may be configured at any rotation to, for example, alter read or write characteristics.

The MR device is configured such that during a read sequence, a sense current ($i_s$) is passed from the from the first sense line 612 to the second sense line 614 through the MR element 602. The sense current ($i_s$) is used to obtain a metric that is indicative of the resistance across the MR element 602. Because the sense current flows in the plane of the layers of the MR element 602, the device is known as a current-in-plane (CIP) device.

In another embodiment, a bias current is applied only during a read sequence. In that case, a write driver will not apply a current to the word line 604 at the same time that the bias driver is applying a current to the word line 604.

4. Method of Switching a Logical State

Figure 7:
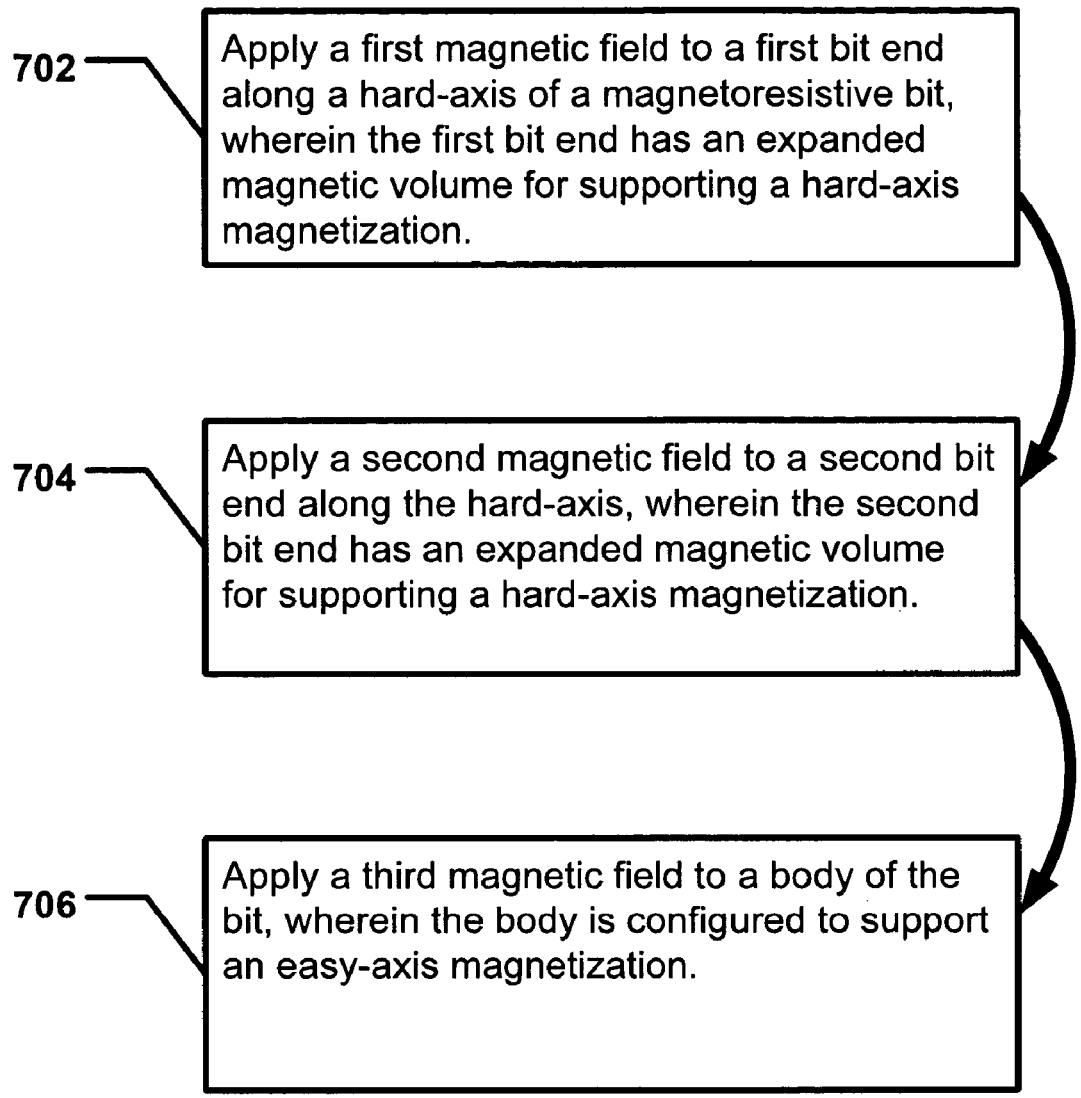
FIG. 7 is a process flow diagram of a magnetic switching method.

A logical state of a magnetoresistive bit is determinable from the magnetization direction of magnetic layers of the bit. Thus, the state of the bit may be switched by switching the magnetization direction of the magnetic layer(s). FIG. 2 shows an example of rotation of the magnetization direction of the bit ends leading rotation a magnetization direction of a body of the bit. With the sequence of FIG. 2 in mind, FIG. 7 shows an improved method of switching the magnetization direction of a magnetoresistive bit. The method comprises: at step 702, applying a first magnetic field to a first bit end along a hard-axis, wherein the first bit end has an expanded hard-axis magnetic volume; at step 704, applying a second magnetic field to a second bit end along the hard-axis, wherein the second bit end has an expanded hard-axis magnetic volume; and at step 706, applying a third magnetic field to the body of the bit, wherein the body is configured to support an easy-axis magnetization.

In one embodiment, the first magnetic field acts to rotate the magnetization direction of the first bit end so as to ensure that the first bit end has a magnetization along the hard-axis. Likewise, the second magnetic field acts to rotate the magnetization direction of the second bit end so as to ensure that the second bit end has a magnetization along the hard-axis. As an example, this is shown by the bit end summary arrows of Frames (b)–(d) of FIG. 2. In another embodiment, the first and second magnetic fields are applied by passing a current through a conducting line arranged near the bit. For example, in an embodiment of FIG. 6, the bit line 610 may carry a current for generating the first and second magnetic fields.

According to a further embodiment of the invention, the bit ends are configured such that during a resting state (no applied magnetic field), the bit ends have antiparallel magnetizations along the hard-axis relative to one another. During switching, magnetic fields acting upon the bit ends force a parallel magnetization of the bit ends along the hard-axis as shown in FIG. 3, for example. Thus, when a hard-axis field is applied, the bit-end states become parallel, so that an easy-axis field can now switch the magnetization direction of the bit. When the hard-axis field is removed, the bit ends become anti-parallel again. Thus, in this embodiment, bit end magnetization is volatile.

5. Conclusion

A variety of embodiments have been described above. More generally, those skilled in the art will understand that changes and modifications may be made to these embodiments without departing from the true scope and spirit of the present invention, which is defined by the claims. Thus, references to, for example, specific thicknesses, materials, and fabrication methods are meant to be illustrative rather than limiting. Device design, processing, and test conditions all affect magnetization switching characteristics and are therefore should be considered.

I claim:

1. A method of switching a magnetization of a magnetic layer comprising:
    applying a first hard-axis magnetic field to a first end of the layer, wherein the first end has an expanded hard-axis magnetic volume;
    applying a second hard-axis magnetic field to a second end of the layer, wherein the second end has an expanded hard-axis magnetic volume; and
    applying an easy-axis magnetic field to a body of the bit, wherein the body is configured to support an easy-axis magnetization.

2. The method for switching of claim 1, further comprising:
    in response to applying the first and second magnetic fields, forcing a magnetic state of the first end to become parallel with a magnetic state of the second end.

3. The method for switching of claim 2, further comprising:
    removing the applied magnetic fields; and
    returning the magnetic states of the ends to an anti-parallel state.

4. The method of claim 1, wherein applying both the first and second magnetic fields comprises passing a current through a conducting line arranged near the bit.

5. The method of claim 1, wherein the easy-axis is substantially perpendicular to the hard-axis.

6. A method for switching a magnetization of a magnetic layer comprising:
    applying a first magnetic field to an end of the layer for rotating elemental magnetization directions within the layer toward a hard-axis direction, wherein the end has an expanded hard-axis magnetic volume;
    applying a second magnetic field to a body of the bit, wherein the body is configured to support an easy-axis magnetization.

7. The method for switching of claim 6, further comprising applying a bias current during a read sequence.

8. The method for switching of claim 6, wherein the first magnetic field is substantially a hard-axis magnetic field.

* * * * *